United States Patent [19]
Chen et al.

[11] Patent Number: 6,140,179
[45] Date of Patent: Oct. 31, 2000

[54] METHOD OF FORMING A CROWN CAPACITOR FOR A DRAM CELL

[75] Inventors: Yinan Chen, Taipei; Shih-chi Hsu, Chungli; Tse Yao Huang, Taipei, all of Taiwan

[73] Assignee: Nanya Technology Corporation, Taiwan

[21] Appl. No.: 09/326,651

[22] Filed: Jun. 7, 1999

[30] Foreign Application Priority Data

Mar. 26, 1999 [CN] China ................................. 088104811

[51] Int. Cl.⁷ ............................................. H01L 21/8242
[52] U.S. Cl. .......................................... 438/254; 438/397
[58] Field of Search .................................. 438/253–256, 438/393–399

[56] References Cited

U.S. PATENT DOCUMENTS 5,827,783  10/1998  Hsai et al. ............................. 438/735
5,926,719  10/1998  Sung ..................................... 438/396

Primary Examiner—Jey Tsai
Attorney, Agent, or Firm—George T. Marcou; Kilpatrick Stockton LLP

[57] ABSTRACT

The present invention discloses a method of forming a crown capacitor for a DRAM cell. An etching method having different selectivity between the BPSG and silicon oxynitride layer is applied to form a sacrificial structure with a concanovenex sidewall. Using the sacrificial structure as a mold, a high capacitance crown capacitor is obtained.

14 Claims, 8 Drawing Sheets

METHOD OF FORMING A CROWN CAPACITOR FOR A DRAM CELL

BACKGROUND OF THE INVENTION

1. Field of the Invention

The present invention relates to a crown capacitor, and particularly to a high capacitance crown capacitor for a DRAM cell and a method of manufacturing the same.

2. Description of the Related Arts

Referring to FIG. 1, a conventional DRAM cell consists of a transistor T and a capacitor C. The source of the transistor T is connected to a corresponding bit line BL. The drain of the transistor T is connected to the bottom electrode of the capacitor C. The gate of the transistor is connected to a corresponding word line WL. The top electrode of the capacitor C is biased with a constant voltage source. A dielectric layer is arranged between the bottom electrode and the top electrode. As known to those skilled in the art, the bottom capacitor C is provided for data storage. Therefore, the capacitor requires a large capacitance to prevent data loss and lower the refresh rate.

For a conventional DRAM of less than 1MB capacity, a two-dimensional capacitor structure is utilized for data storage. This capacitor structure is well known as a planar-type capacitor. However, in order to provide a capacitance large enough for data storage, the planar-type capacitor occupies a very large base area. Therefore, this structure can not be applied in a high-density DRAM process.

Accordingly, some three-dimensional capacitor structures, such as a trench-type or stack structure, have been developed to satisfy the requirements of highly integrated DRAM devices of more than 16MB. However, the formation of trench-type structures results in defects in the substrate, thereby increasing current leakage and affecting the device performance. Moreover, since the etching rate of the trench decreases as the aspect ratio increases, the process becomes more difficult, and the DRAM productivity is reduced. Therefore, the trench-type structure is not useful in practical applications. The stack capacitor, on the other hand, is free of all the problems mentioned above. It is therefore very popular in small-dimensional memory fabrication and has attracted a lot of attention regarding structure optimization.

Among all the kinds of stack capacitors, the crown capacitor in which an electrode has an upright extending portion to provide a very large area for data storage is favored for highly-integrated memory devices, especially for those have a capacity of more than 64MB.

The conventional process of forming a crown capacitor for a DRAM cell will be described in accompaniment with the drawings of FIGS. 2A through 2C.

Referring to FIG. 2A, a semiconductor substrate 200 is provided. The substrate 200 has a field oxide layer 202 formed thereon to define an active region. A gate electrode G including a gate oxide layer 204, a polysilicon layer 210, a tungsten silicide layer (WSi$_x$) 212, a silicon oxide layer 214, and a silicon oxynitride layer (SiO$_x$N$_y$) 216 is formed on the active region. A lightly doped source/drain region is formed using the gate electrodes G as a mask, usually by implanting an N-type impurity such as arsenic or phosphorous. A gate spacer 217 is formed on the sidewall of the gate structure G by depositing and anisotropically etching back an insulation layer. Then the complete source/drain region 208 is formed by implanting an N-type impurity into the substrate 200 using -he gate structure G and the spacer 217 as a mask.

After forming the transistors on the substrate 200, an insulation layer 218 and a stop layer 222 are successively formed over the substrate 200. A contact hole 224 is formed in the insulation layer 218 and the stop layer 222 to expose a portion of the source/drain region 208. Then a first conducting layer 226 is formed on the stop layer and fills the contact hole 224. Then a sacrificial layer 228 is formed on the first conducting layer 226.

Referring to FIG. 2B, the sacrificial layer 228 and the first conducting layer 226 are patterned and etched to the surface of the stop layer 222.

Turning to FIG. 2C, a second insulation layer 230 is conformally formed over the patterned sacrificial layer 228, patterned first conducting layer, and stop layer 222.

Referring to FIG. 2D, the second inducting layer 230 is etched back to the surface of the stop layer 222; thereby, the top surface of the sacrificial layer 228 is exposed.

Turning to FIG. 2E, the remaining sacrificial layer 228 is removed; thereby, the remaining first conducting layer 230 and second conducting layer 226 form the bottom electrode of the crown capacitor 240.

Referring to FIG. 2F, a dielectric layer 242 and a third conducting layer 244 used as top electrode of the crown capacitor are successively formed over the bottom electrode 240. As a result, a crown capacitor according to the conventional method is formed.

Obviously, the conventional method only uses one patterned sacrificial layer 228 as a model to form the bottom electrode; thereby, the sidewall of the bottom electrode is smooth and can't provide high capacitance.

SUMMARY OF THE INVENTION

It is therefore an object of the invention to provide a high capacitance crown capacitor for a DRAM cell, and a method of fabricating the same.

According to the object of the invention, a method of forming a crown capacitor for a semiconductor memory device is provided, said memory device having a field effect transistor including a source/drain region and a gate element. The method comprises the steps of: forming an insulation layer over said field effect transistor; forming a stop layer over said insulation layer; forming a contact hole through said insulation layer to expose said source/drain region; conformally forming a first conducting layer over said insulation layer and filling said contact hole with said first conducting layer; forming a sacrificial layer over said insulation layer and said first conducting layer, said sacrificial layer being composed of a plurality of alternating BPSG layers and silicon oxynitride layers; patterning said sacrificial layer and said first conducting layer, thereby forming a sacrificial structure with a vertical sidewall over said source/drain region; selectively removing portions of said BPSG layers and said silicon oxynitride layer, thereby transferring the sidewall of said sacrificial structure from vertical type to concanoconvex type; forming a second conducting layer over said sacrificial structure; forming a spacer from said second conducting layer on the sidewall of said sacrificial structure; removing said sacrificial structure; forming a dielectric layer over said first conducting layer and second conducting layer; and forming a third conducting layer over said dielectric layer.

Other objects, features, and advantages of the present invention will become apparent from the following detailed description which makes reference to the accompanying drawings.

DETAILED DESCRIPTION OF THE INVENTION

Without intending to limit it in any manner, the present invention will be further illustrated by the following examples.

Figure 1:
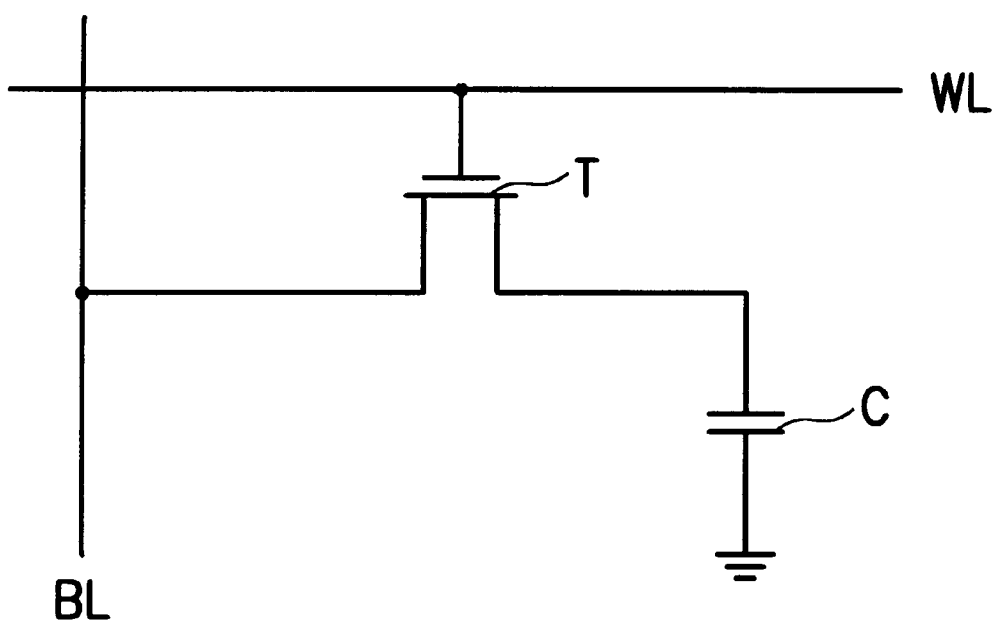
FIG. 1 is a schematic diagram illustrating a DRAM cell.
Figure 2A:
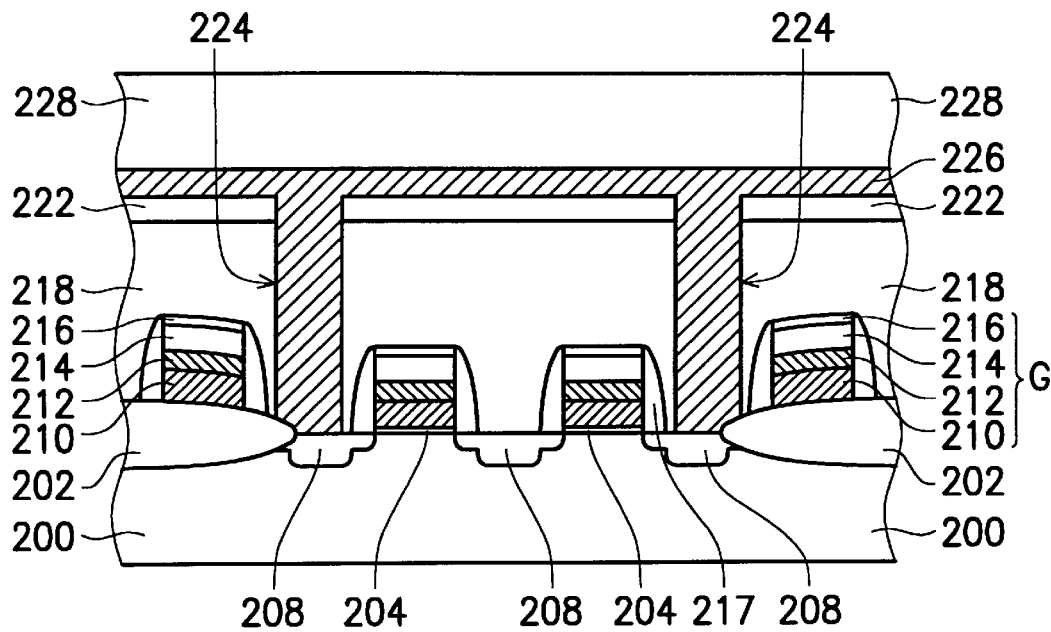
FIGS. 2A through 2F are cross-sectional views illustrating the fabrication steps of a conventional crown capacitor.
Figure 2B:
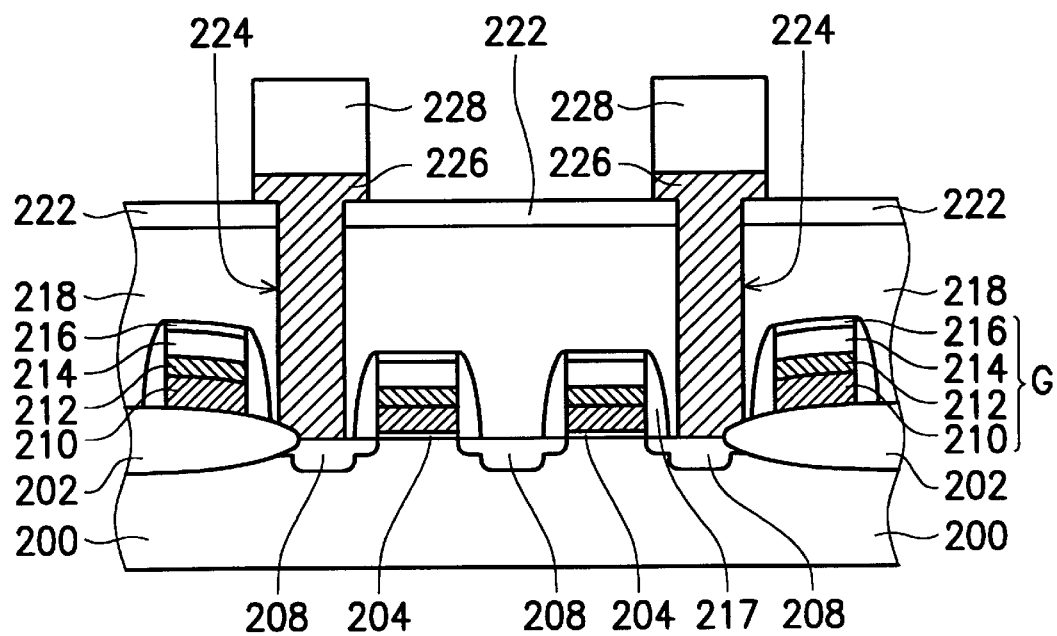
Figure 2C:
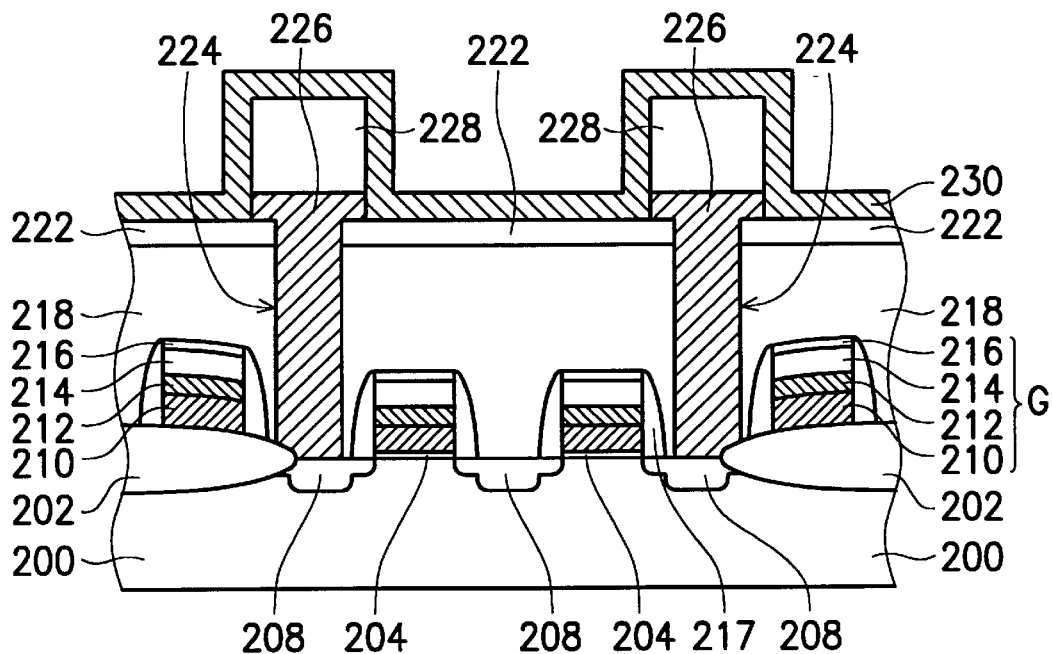
Figure 2D:
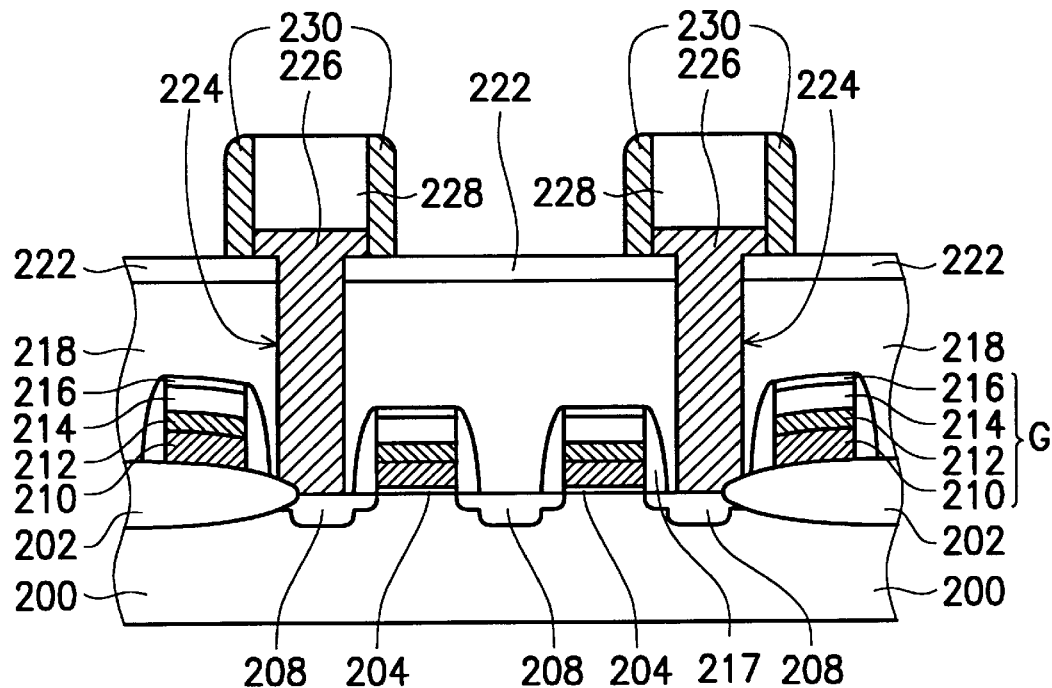
Figure 2E:
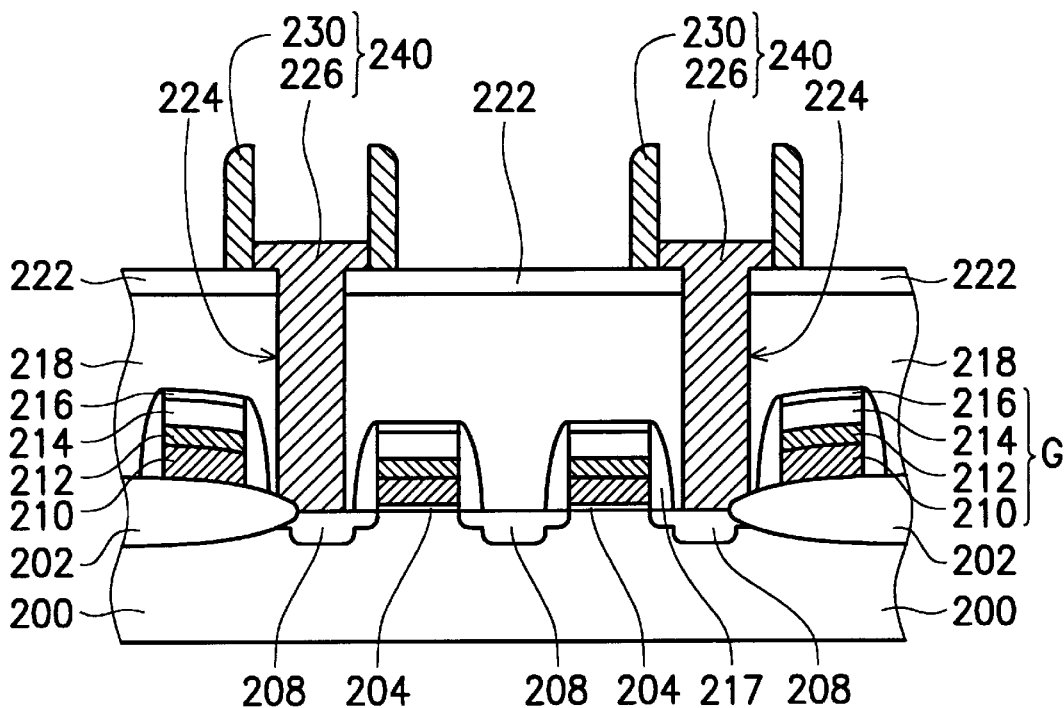
Figure 2F:
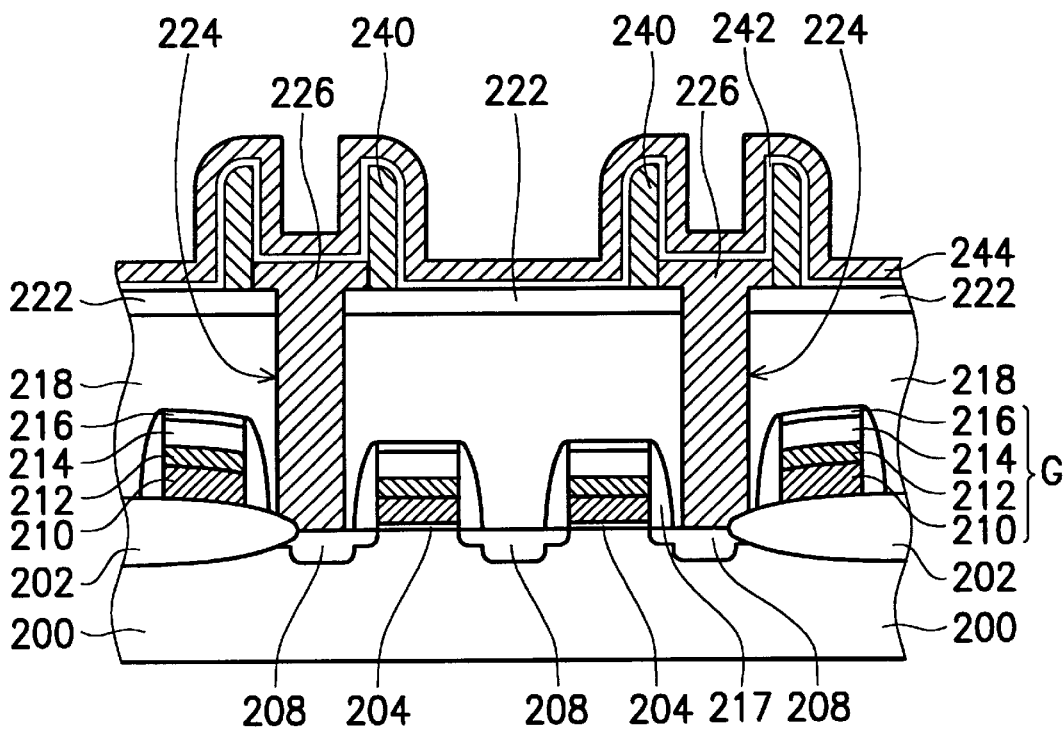
Figure 3A:
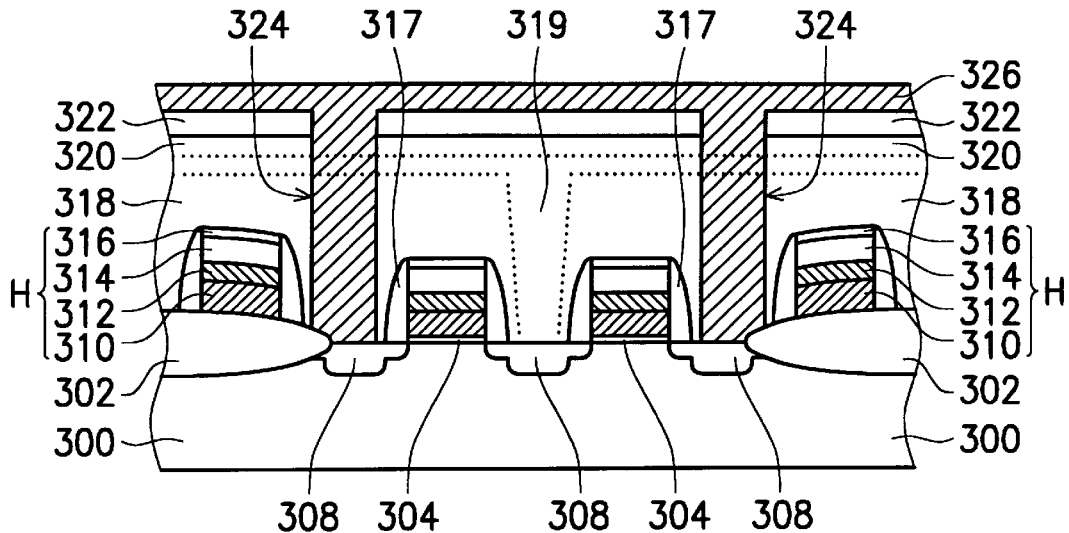
FIGS. 3A through 3H are cross-sectional views illustrating the fabrication steps of a crown capacitor according to the present invention.

The method of making a crown capacitor for a DRAM cell according to the present invention can be applied in a memory cell, such as a DRAM cell having a MOSFET switch element with an N-channel or a P-channel. A DRAM cell having a MOSFET with an N-channel is used as an example. Referring to FIG. 3A, a representative portion of a transistor including a gate electrode H and a source/drain region 306 formed over a semiconductor substrate 300 is shown in cross-section. The preferred substrate 300 is composed of a P-type single crystal silicon having a <100> crystallographic orientation. The active region of the transistor may be defined by a field oxide layer 302, which is formed by, for example, the LOCOS method. The gate electrode H is formed by successively depositing a gate oxide layer 304, a polysilicon layer 310, a tungsten silicide layer (WSi$_x$) 312, a silicon oxide layer 314, and silicon oxynitride layer 316 over the substrate, then patterning these layers. A lightly doped source/drain region is formed using the gate structure H as a mask and implanting an N-type impurity into the semiconductor substrate 300. A gate spacer 317 is formed on the sidewall of the gate H by depositing and etching back an insulation layer. A source/drain region 308 with an LDD design is completely formed by implanting an N-type impurity at a concentration higher than that used in forming the lightly doped source/drain using the gate electrode H and the spacer 317 as a mask.

After the transistor is formed, at least one planar insulation layer is formed thereon to isolate the transistor and conducting layers which will be formed later and to offer a good planar surface for the following procedure. Moreover, corresponding conducting lines can be arranged in the insulation layer. In one embodiment, a first insulation layer 318 is formed over the substrate 300 by chemical vapor deposition (CVD) method. Then first insulation layer 318 is patterned to form a contact hole contacting the source/drain region 306. Then a conducting layer is formed over the first insulation layer 318 and fills the contact hole to contact the source/drain 306. Then the conducting layer is patterned as a bit line 319. Since the bit line 319 is not present in the cross-sectional plane, it is illustrated by a dashed line in the figure. After the bit line 319 is formed, a second insulation layer 320 is deposited over the first insulation layer 318 and the bit line 329. The first and second insulation layer 318 and 320 can be chosen from silicon oxide, silicon nitride, borosilicate glass (BSG), phosphosilicate glass (PSG) or borophosphosilicate glass (BPSG). Among them, borophosphosilicate is preferred.

To protect the above insulation layers and the transistor from damage in the following etching steps, a stop layer 322 is formed over the second insulation layer 320. The material of stop layer 322 is different from the above insulation layers. The stop layer 322 can be a silicon nitride layer and is deposited by CVD method to a thickness of about 600–800 angstroms using dichlorosilane and ammonia as sources.

Then a contact hole 324 contacting the source/drain 308 is formed in the stop layer 322 and the insulation layers 318 and 320. A conducting layer 326 is formed over the second insulation layer 320 and fills the contact hole 324, thus forming an electric contact to the source/drain region 306. The conducting layer 326 can be chosen from tungsten, tungsten silicide, or doped polysilicon. Among them, doped polysilicon is preferred.

Figure 3B:
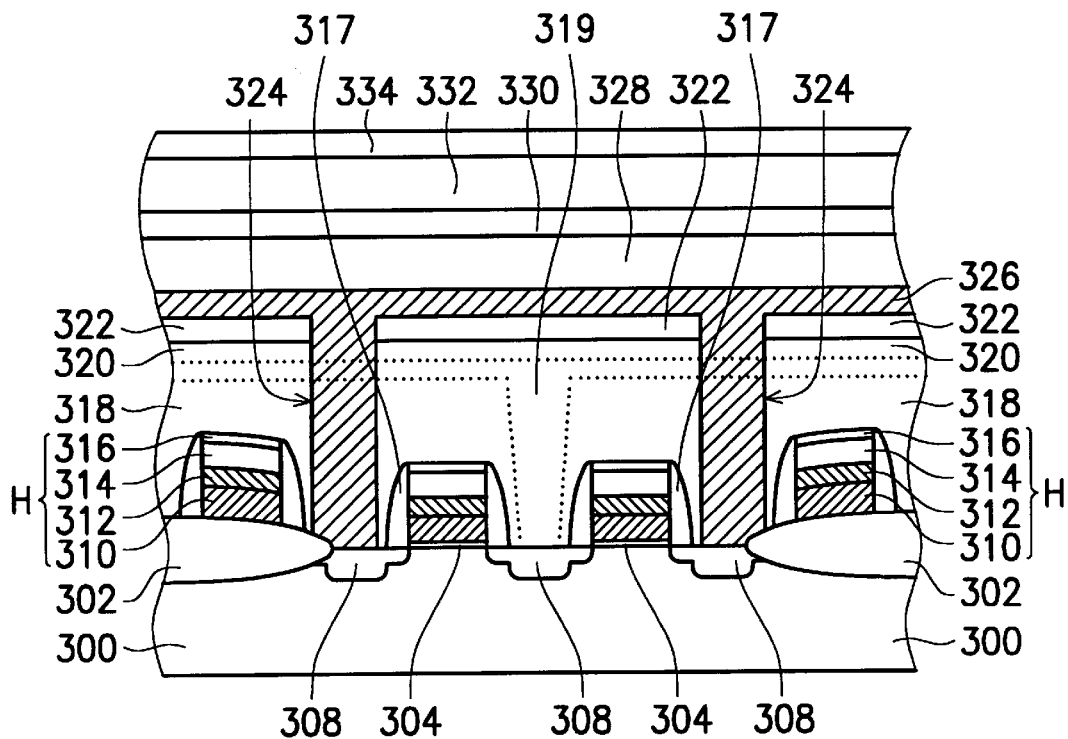

Referring to FIG. 3B, a sacrificial layer consisting of alternating BPSG layers (328 and 332) and silicon oxynitride layers (330 and 334) is deposited over the stop layer 322. Generally, the sacrificial layer can have several sublayers. The sacrificial layer can be composed of odd sublayers and even sublayers. The odd sublayers can be BPSG layers and the even sublayers can be silicon oxynitride layers, or alternatively, the odd sublayers can be silicon oxynitride layers and the even sublayers can be BPSG layers. Here, two BPSG layers and two silicon oxynitride layers formed alternatively are used as an example. The BPSG layers can be deposited by an atomic pressure deposition (APCVD) method using tetraethylorthosilane (TEOS), $O_3/O_2$, triethylborate (TEB) and trimethylphosphoate (TMP) as reactants and to a thickness of about 2000–3000 Å. The silicon oxynitride layer can be deposited by plasma-enhanced chemical vapor deposition (PECVD) method using silane ($SiH_4$), $N_2O$ and $O_2$ as reactants and to a thickness of about 1600–2000 Å.

Figure 3C:
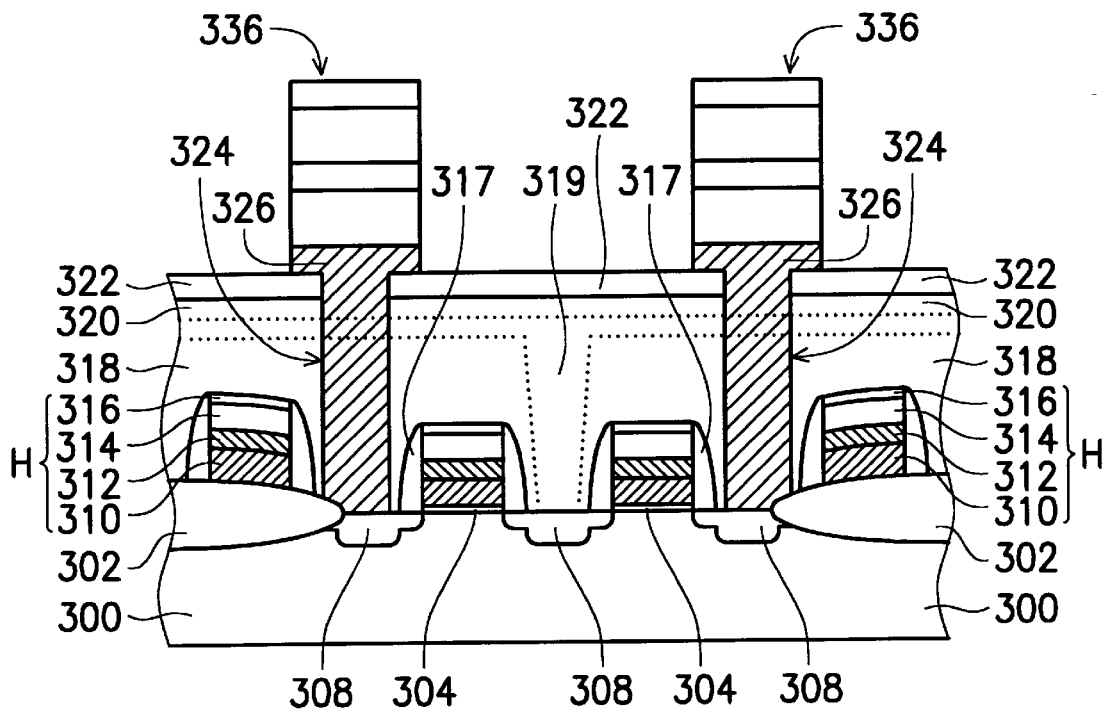

Referring to FIG. 3C, the BPSG layers 328 and 332 and silicon oxynitride layer 330 and the first conducting layer 326 are patterned to define the region of the crown capacitor; thereby, a sacrificial structure 336 with a vertical sidewall is formed over the source/drain region 308. In this step, a photolithography technique and anisotropic etching method are used.

Figure 3D:
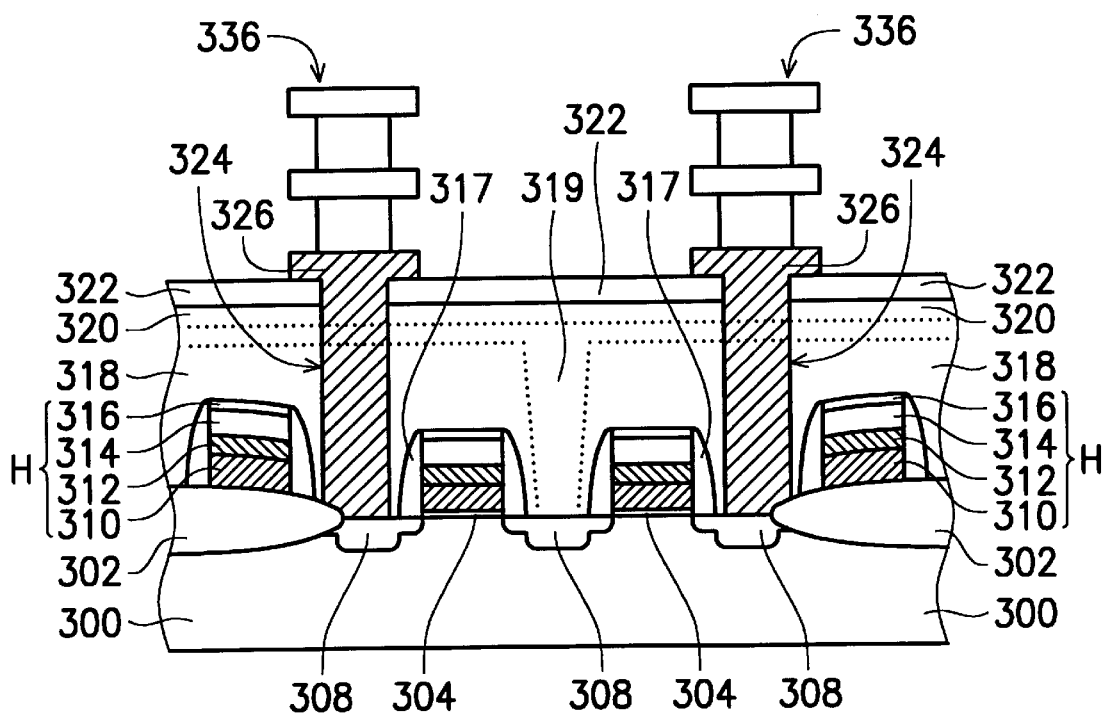

FIG. 3D illustrates the key step of the present invention. In this step, a etching method having different selectivity towards the sublayers of the sacrificial layer must be applied. In this example, portions of the BPSG layers and the silicon oxynitride are selectively removed by a solution having a greater selectivity towards BPSG compared to silicon oxynitride. The solution contains about 0.5–1.5% diluted hydrogen fluoride (DHF), which has a ratio selectivity of 5:1 (400 Å/min:80 Å/min) with respect to the BPSG layer and the silicon oxynitride layer.

After treatment with the solution for a period of time, the vertical sidewall of the sacrificial structure 336 is changed into a concanoconvex sidewall because a greater amount of the BPSG layer is removed than the silicon oxynitride layer. This is due to the different susceptibilities to the solution of the BPSG layer and silicon oxynitride layer.

Figure 3E:
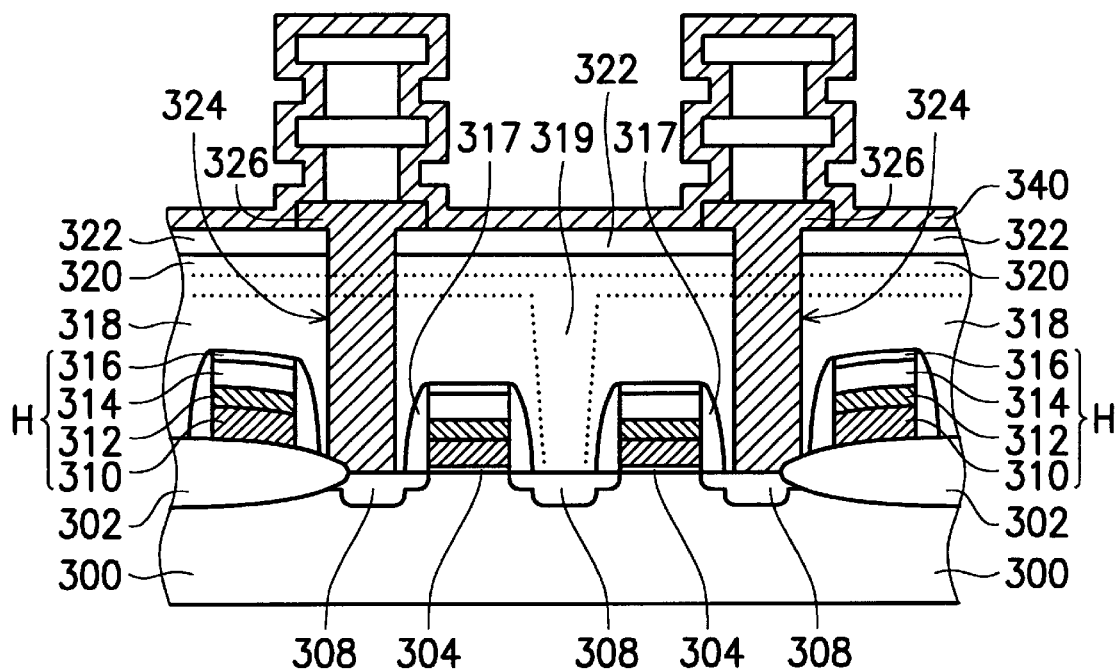

Referring to FIG. 3E, a second conducting layer 340 is conformally formed over the sacrificial structure 336 and the stop layer 322. The second conducting layer 340 has a thickness of about 500–1000 Å. The second conducting layer 340 can be composed of tungsten, tungsten silicide, or doped polysilicon. Among them, doped polysilicon is preferred.

Figure 3F:
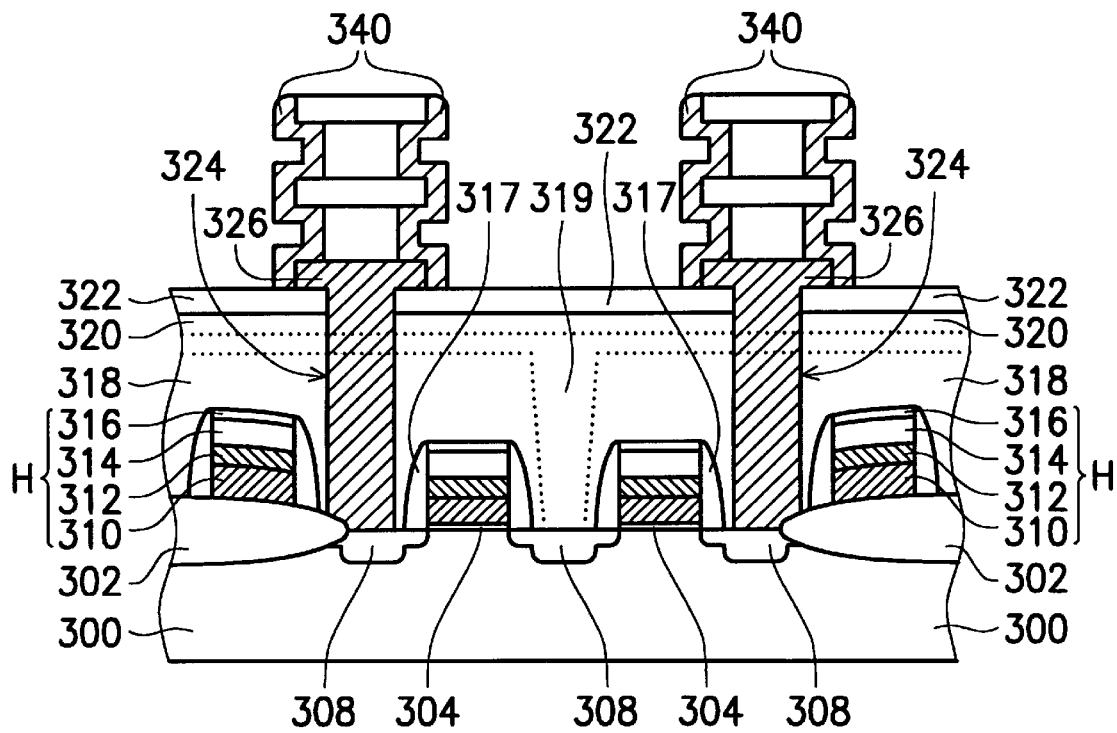

Referring to FIG. 3F, an anisotropically etching step is applied to etch back the second conducting layer 340 until the top surface of the stop layer 322. Thereby, the portion of the second conducting layer 340 over the top surface of the sacrificial structure 336 is removed and the top surface of the sacrificial structure 336 is exposed. The etching step can be applied by using a reactive ion etch method, using chlorine, hydrogen chloride or silicon chloride as a reactant.

Figure 3G:
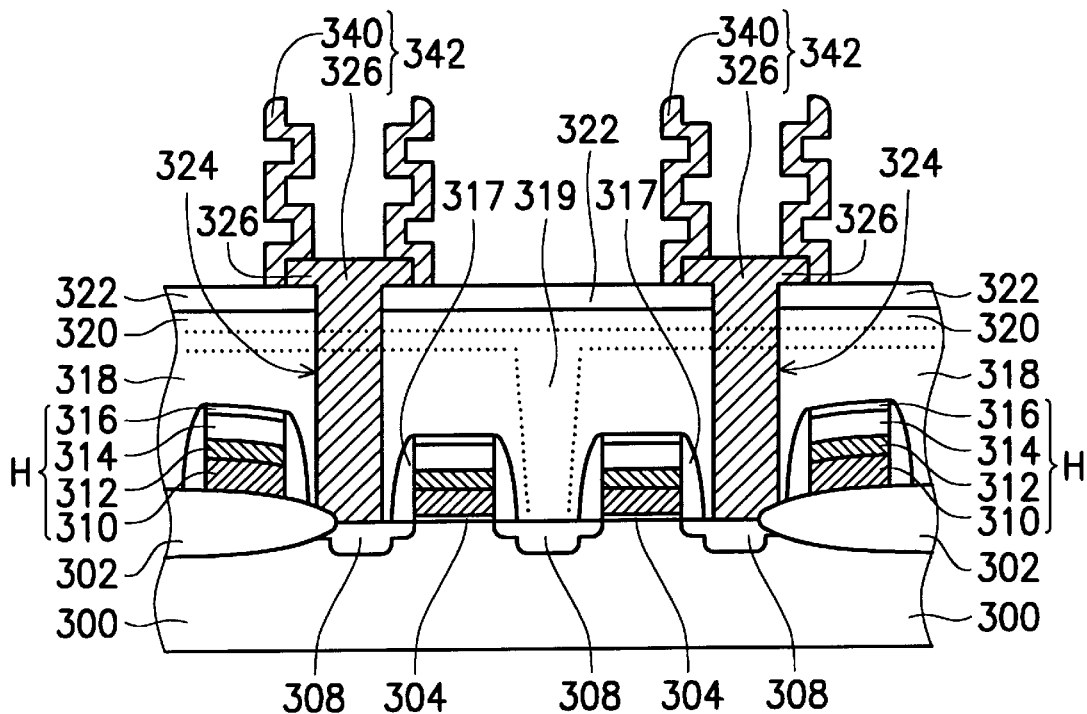

Referring to FIG. 3G, the sacrificial structure 336 is selectively removed. Therefore, the bottom electrode 342 comprised of the remaining first and second conducting layer is formed and has a concanoconvex sidewall. In this example, a wet etching method using 5% hydrogen fluoride and 85% phosphoric acid can be employed.

Figure 3H:
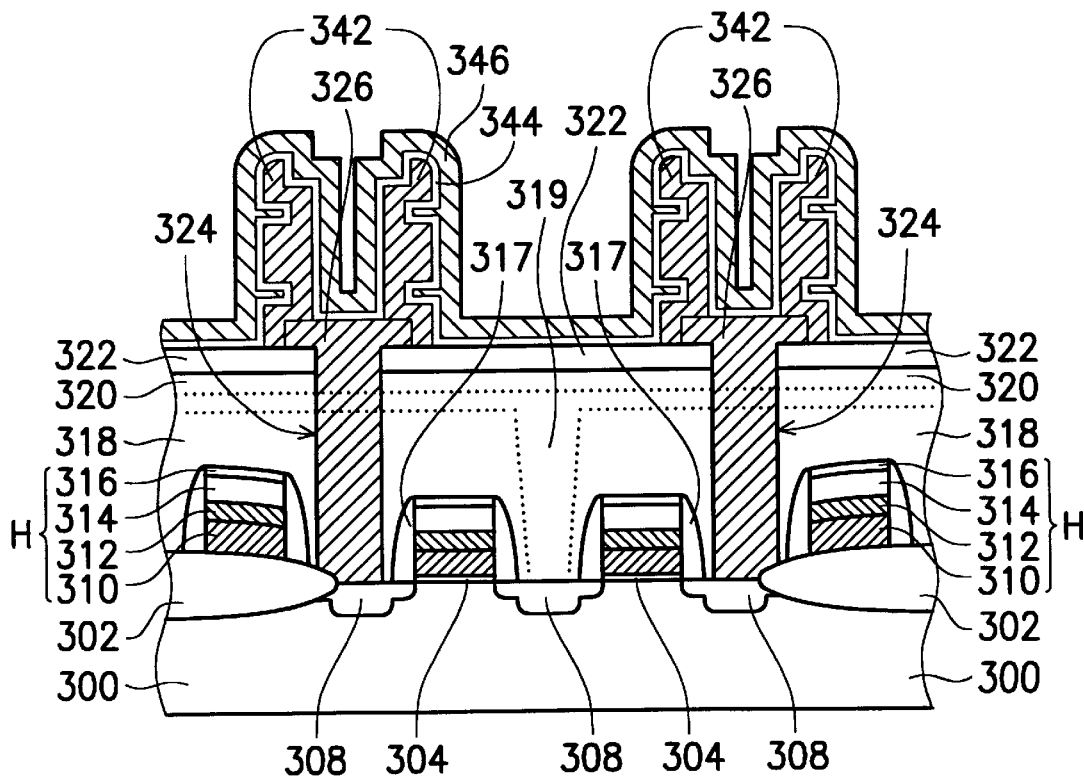

Finally, as shown in FIG. 3H, a conformal dielectric layer 344 and a third conducting layer 346 are sequentially formed over the bottom electrode 342. The dielectric layer 344 can be composed of a material with a high dielectric constant such as oxide/silicon nitride/oxide (ONO) or $Ta_2O_5$. The preferred dielectric layer 344 has a thickness of about 50–70 Å. The third conducting layer 346 is used as a top electrode and can be made of doped polysilicon, tungsten, tungsten silicide or titanium nitride. The preferred third electrode has a thickness of about 1500–2000 Å. Therefore, a crown capacitor comprising a third conducting layer 346 as the top electrode, a dielectric layer 344, and a bottom electrode comprised of the first and second layers 326 and 340 is obtained.

In the aforementioned method of the invention, a plurality of hemispherical silicon grains (HSG) or rugged polysilicon structures can be formed over the bottom electrode before the formation of the dielectric layer, thereby increasing the electrode area.

According to the present invention, a capacitor having high capacitance is formed. The invention provides the advantages of: (1) simple fabrication a crown capacitor which has high capacitance due to its concanoconvex sidewall; and (2) easy elevation of the capacitance of the crown capacitor by increasing the number of the sacrificial layers.

While the invention has been particularly shown and described with the reference to the preferred embodiment thereof, it will be understood by those skilled in the art that various changes in form and details may be made without departing from the spirit and scope of the invention.

What is claimed is:

1. A method of forming a crown capacitor for a semiconductor memory device, said memory device having a field effect transistor including a source/drain region and a gate element, which comprises the steps of:

forming an insulation layer over said field effect transistor;

forming a stop layer over said insulation layer;

forming a contact hole through said insulation layer to expose said source/drain region;

conformally forming a first conducting layer over said insulation layer and filling said contact hole with said first conducting layer;

forming a sacrificial layer over said insulation layer and said first conducting layer, said sacrificial layer being composed of a plurality of alternating BPSG layers and silicon oxynitride layers;

patterning said sacrificial layer and said first conducting layer, thereby forming a sacrificial structure with a vertical sidewall over said source/drain region;

selectively removing portions of said BPSG layers and said silicon oxynitride layer, whereby transferring the sidewall of said sacrificial structure from vertical type to concanoconvex type;

forming a second conducting layer over said sacrificial structure;

forming a spacer from said second conducting layer on the sidewall of said sacrificial structure;

removing said sacrificial structure;

forming a dielectric layer over said first conducting layer and second conducting layer; and forming a third conducting layer over said dielectric layer.

2. The method as claimed in claim 1, wherein said spacer is formed by etching back said second conducting layer until said sacrificial structure is reached.

3. The method as claimed in claim 1, wherein said stop layer is formed of silicon nitride.

4. The method as claimed in claim 1, wherein said BPSG layers has a thickness in a range between about 2000–3000 angstroms.

5. The method as claimed in claim 1, wherein said silicon oxynitride layers has a thickness in a range between about 1600–2000 angstroms.

6. The method as claimed in claim 1, wherein said etching method uses a solution containing hydrogen fluoride.

7. The method as claimed in claim 6, wherein said solution contains about 1% hydrogen fluoride.

8. The method as claimed in claim 1, wherein said sacrificial layer is removed by a solution having hydrogen fluoride and phosphoric acid.

9. The method as claimed in claim 8, wherein said solution contains about 5% hydrogen fluoride and about 85% phosphoric acid.

10. A method of forming a crown capacitor for a semiconductor memory device, said memory device having a field effect transistor including a source/drain region and a gate element, which comprises the steps of:

forming an insulation layer over said field effect transistor;

forming a stop layer over said insulation layer;

forming a contact hole through said insulation layer to expose said source/drain region;

conformally forming a first conducting layer over said insulation layer and filling said contact hole with said first conducting layer;

forming a sacrificial layer over said insulation layer and said first conducting layer, said sacrificial layers being composed of a plurality of alternating BPSG layers and silicon oxynitride layers;

patterning said sacrificial layer and said first conducting layer, thereby forming a sacrificial structure with a vertical sidewall over said source/drain region;

selectively removing portions of said BPSG layers and said silicon oxynitride layer with a first solution containing hydrogen fluoride, whereby transferring sidewall of said sacrificial structure from vertical type to concanoconvex type;

forming a second conducting layer over said sacrificial structure;

forming a spacer from said second conducting layer on the sidewall of said sacrificial structure;

selectively removing said sacrificial structure by a second solution containing hydrogen fluoride and phosphoric acid;

forming a dielectric layer over said first conducting layer and second conducting layer; and forming a third conducting layer over said dielectric layer.

11. The method as claimed in claim 10, wherein said spacer is formed by etching back said second conducting layer until said sacrificial structure is reached.

12. The method as claimed in claim 10, wherein said first solution contains about 1% hydrogen fluoride.

13. The method as claimed in claim 12, wherein said solution has a ratio selectivity of about 5:1 with respect to the BPSG layer and the silicon oxynitride layer.

14. The method as claimed in claim 10, wherein said second solution contains about 5% hydrogen fluoride and about 85% phosphoric acid.

* * * * *